(12) United States Patent
Koide

(10) Patent No.: US 7,869,252 B2
(45) Date of Patent: Jan. 11, 2011

(54) FERROELECTRIC MEMORY DEVICE, METHOD FOR DRIVING FERROELECTRIC MEMORY DEVICE, AND ELECTRONIC EQUIPMENT

(75) Inventor: Yasunori Koide, Matsumoto (JP)

(73) Assignee: Seiko Epson Corporation (JP)

( * ) Notice: Subject to any disclaimer, the term of this patent is extended or adjusted under 35 U.S.C. 154(b) by 38 days.

(21) Appl. No.: 12/475,628

(22) Filed: Jun. 1, 2009

(65) Prior Publication Data

US 2009/0310397 A1    Dec. 17, 2009

(30) Foreign Application Priority Data

Jun. 13, 2008    (JP)    ............... 2008-155679

(51) Int. Cl.
  *G11C 11/22*    (2006.01)
(52) U.S. Cl. ...................................... 365/145
(58) Field of Classification Search ............. 365/145
  See application file for complete search history.

(56) References Cited

U.S. PATENT DOCUMENTS

| | | | |
|---|---|---|---|
| 6,487,103 B2 | 11/2002 | Yamamoto et al. | |
| 6,661,697 B2 * | 12/2003 | Yamamoto et al. | ......... 365/145 |
| 7,012,829 B2 | 3/2006 | Kawashima et al. | |
| 7,227,769 B2 * | 6/2007 | Fukushi et al. | ............. 365/145 |

FOREIGN PATENT DOCUMENTS

| | | |
|---|---|---|
| JP | 59-090425 | 5/1984 |
| JP | 2002-133857 | 5/2002 |
| JP | 2005-293818 | 10/2005 |
| JP | 2008-059722 | 3/2008 |
| JP | 2008-059723 | 3/2008 |
| JP | 2008-059724 | 3/2008 |
| JP | 2008-140493 | 6/2008 |
| WO | WO2004-093088 | 10/2004 |

* cited by examiner

*Primary Examiner*—Hoai V Ho
*Assistant Examiner*—Anthan T Tran
(74) *Attorney, Agent, or Firm*—Harness, Dickey & Pierce, P.L.C.

(57) ABSTRACT

A ferroelectric memory device includes: a memory cell having a ferroelectric capacitor connected between a plate line and a bit line; a first node connected to the bit line through a charge transfer MISFET; a potential generation circuit that has a first capacitor having a first terminal connected to the first node and a first switching MISFET connected to a second terminal of the first capacitor, and is capable of setting the first node to a negative potential; and a sense amplifier connected to the second terminal of the first capacitor. When reading a charge stored in the ferroelectric capacitor, the potential generation circuit sets the first node at a negative potential and then sets the first switching MISFET to an off state, thereby setting the second terminal of the first capacitor to a floating state, and the sense amplifier amplifies a potential on the second terminal of the first capacitor in the floating state.

12 Claims, 12 Drawing Sheets

US 7,869,252 B2

FERROELECTRIC MEMORY DEVICE, METHOD FOR DRIVING FERROELECTRIC MEMORY DEVICE, AND ELECTRONIC EQUIPMENT

The entire disclosure of Japanese Patent Application No. 2008-155679, filed Jun. 13, 2008 is expressly incorporated by reference herein.

BACKGROUND

1. Technical Field

The present invention relates to ferroelectric memory devices, and in particular, to readout technology for ferroelectric memory devices.

2. Related Art

For reading a ferroelectric memory device (FeRAM: Ferroelectric Random Access Memory), a method employing a latch-type sense amplifier circuit may be used. In this case, the voltage applied to the plate line is voltage-divided between the ferroelectric capacitor capacitance (Cs) and the bit line capacitance (Cbl). As a result, an adequate potential is not applied to ferroelectric capacitors due to the bit line capacitance (Cbl). Furthermore, because differences in bit line voltages are amplified by a sense amplifier and readout, the more the bit line capacitance (Cbl) increases, the smaller the bit line voltage becomes, so that the sense margin decreases.

Accordingly, readout circuits which can fix bit lines at virtual ground potentials are being examined (e.g., bit line GND sense system). Ferroelectric memory devices according to the aforementioned system are described in, for example, Japanese Laid-open Patent Application JP-A-2002-133857 (Patent Document 1), Published International Application WO 2004/093088 (Patent Document 2) and Japanese Laid-open Patent Application JP-A-2005-293818 (Patent Document 3).

According to the bit line GND sense system described above, a capacitance Ctank for storing a negative charge is used for fixing the pMOS (MOS: Metal Oxide Semiconductor) that controls the supply of charge to the bit line and the bit line at the ground (GND) potential. By supplying the negative charge stored in the capacitance Ctank to the bit line through the pMOS, the potential on the bit line can be virtually fixed at the ground potential (see Patent Document 1).

In this case, readout is conducted through detecting a potential change at the other end of the capacitance Ctank, which is the amount of charge supplied from the capacitance Ctank. However, as the potential is a negative potential, it needs to be converted to a positive potential, and thereafter inputted and amplified by a sense amplifier.

For example, according to the circuit (shown in FIG. 1) described in Patent Document 2, a negative potential on the node VNEG is inputted in the sense amplifier SA through the capacitor Ctrans. Also, according to the circuit (shown in FIG. 3) described in Patent Document 3, a negative potential at the node MINS is outputted through the level shift circuit 22.

However, if the conversion efficiency in converting a negative potential to a positive potential is low, the readout margin would lower, and therefore further improvement in the potential conversion efficiency is desired. Also, simplification and area-reduction of the circuit structure are desired.

SUMMARY

In accordance with an advantage of some aspects of the present invention, ferroelectric memory devices which can improve readout margins and achieve size-reduction of the circuit structure can be provided.

(1) In accordance with an embodiment of the invention, a ferroelectric memory device includes: a memory cell having a ferroelectric capacitor connected between a plate line and a bit line; a first node connected to the bit line through a charge transfer MISFET; a potential generation circuit that has a first capacitor having a first terminal connected to the first node and a first switching MISFET connected to a second terminal of the first capacitor, and is capable of setting the first node to a negative potential; and a sense amplifier connected to the second terminal of the first capacitor. When reading a charge stored in the ferroelectric capacitor, the potential generation circuit sets the first node at a negative potential and then sets the first switching MISFET in an off state, thereby setting the second terminal of the first capacitor in a floating state, and a potential on the second terminal of the first capacitor in the floating state is amplified and readout by the sense amplifier.

According to the structure described above, the first node can be set to a negative potential by the first capacitor prior to readout, and the potential on the first node can be converted to a positive potential by the first capacitor at the time of readout. Accordingly, it is not necessary to provide a capacitor independently for positive potential conversion, and the area of the circuit can be reduced. Also, as the positive potential conversion is conducted using a capacitor of a large capacity for hitting a negative charge, such that the readout margin can be improved.

The first switching MISFET may be connected between a ground potential and the second terminal of the first capacitor, and the potential generation circuit may have a second switching MISFET connected between a power supply potential and the second terminal of the first capacitor.

According to the structure described above, by on and off operations of the two switching MISFETs, the potential on the second terminal of the first capacitor can be changed, and the second terminal of the first capacitor can be set in a floating state.

For example, by changing the first and second switching MISFETs from Off and On states to On and Off states, respectively, the first node is set to a negative potential; and by setting the first and second switching MISFETs to Off and Off states, respectively, the second terminal of the first capacitor is set in a floating state.

(2) The potential generation circuit may have a first inverter, and a second capacitor connected between an output of the first inverter and the first node.

According to the structure described above, due to the capacitive coupling of the first and second capacitors, the potential reduction can be made greater when the first node is set to a negative potential. Moreover, the potential on the first node can be more stabilized by the second capacitor. Also, the potential elevation on the first node can be adjusted by the second capacitor whereby the readout margin can be improved.

(3) For example, a source follower circuit may be provided between the second terminal of the first capacitor and the sense amplifier.

For example, the source follower circuit may have a first MISFET that has a gate electrode connected to the second terminal of the first capacitor and is connected between the power supply potential and the sense amplifier, and a second MISFET that has a gate electrode connected to the first node, and is connected between the ground potential and the sense amplifier.

By using the source follower circuit in this manner, the load on the first node can be alleviated, and the current supply capacity for the sense amplifier can be improved.

(4) Preferably, the charge transfer MISFET may be a p-channel type MISFET.

For example, the ferroelectric memory device may have a threshold potential generation circuit connected to a gate electrode of the charge transfer MISFET.

For example, the ferroelectric memory device may have a control circuit that is connected between the bit line and the gate electrode of the charge transfer MISFET, and controls the potential to be applied to the gate electrode according to the potential on the bit line.

For example, the control circuit may have a second inverter that is connected between the bit line and the gate electrode of the charge transfer MISFET, the second inverter having an input section connected to the bit line through a third capacitor, and an output section connected to a gate electrode of the charge transfer MISFET through a fourth capacitor.

According to the structure described above, the potential on the bit line can be fed back to the gate electrode of the charge transfer MISFET.

(5) An electronic equipment in accordance with an embodiment of the invention includes the ferroelectric memory device described above. According to this structure, characteristics of the electronic equipment can be improved. It is noted that the electronic equipment may be any equipment in general that is equipped with the ferroelectric memory device of the invention and performs a predetermined function. Without being limited to any particular structure, the electronic equipment may include any devices that require a memory device, such as, for example, computer devices in general equipped with the ferroelectric memory device described above, cellular phones, PHS, PDA, electronic note books, IC cards and the like.

In accordance with an embodiment of the invention, a method for driving a ferroelectric memory device pertains to a method for driving a ferroelectric memory device that has a memory cell having a ferroelectric capacitor connected between a plate line and a bit line, a first node connected to the bit line through a charge transfer MISFET, a negative potential generation circuit that has a first capacitor having a first terminal connected to the first node and a switching MISFET connected to a second terminal of the first capacitor, and a sense amplifier connected to the second terminal of the first capacitor. The method includes the steps of: 1) changing the potential on the second terminal of the first capacitor from a high potential level to a low potential level to set the first node to a negative potential; 2) setting the switching MISFET to an off state, after the step 1); 3) changing the potential on the plate line from a low potential level to a high potential level to transfer a charge stored in the ferroelectric capacitor to the first node through the charge transfer MISFET, after the step 1); and amplifying the potential on the second terminal of the first capacitor by the sense amplifier, after the step 2), thereby conducting a readout operation.

According to the method described above, the first node is set to a negative potential by the first capacitor before readout, and the potential on the first node can be converted to a positive potential by the first capacitor at the time of readout. Therefore, there is no need to provide an independent capacitor for positive potential conversion, and a readout operation can be performed with a circuit of a smaller area. Also, a capacitor having a large capacity for hitting a negative potential is used for positive potential conversion, such that the readout margin can be improved.

DESCRIPTION OF EXEMPLARY EMBODIMENTS

Preferred embodiments of the invention are described in detail below with reference to the accompanying drawings. It is noted that components having the same function shall be appended with the same or related reference numbers, and their description shall not be repeated.

Embodiment 1

Figure 1:
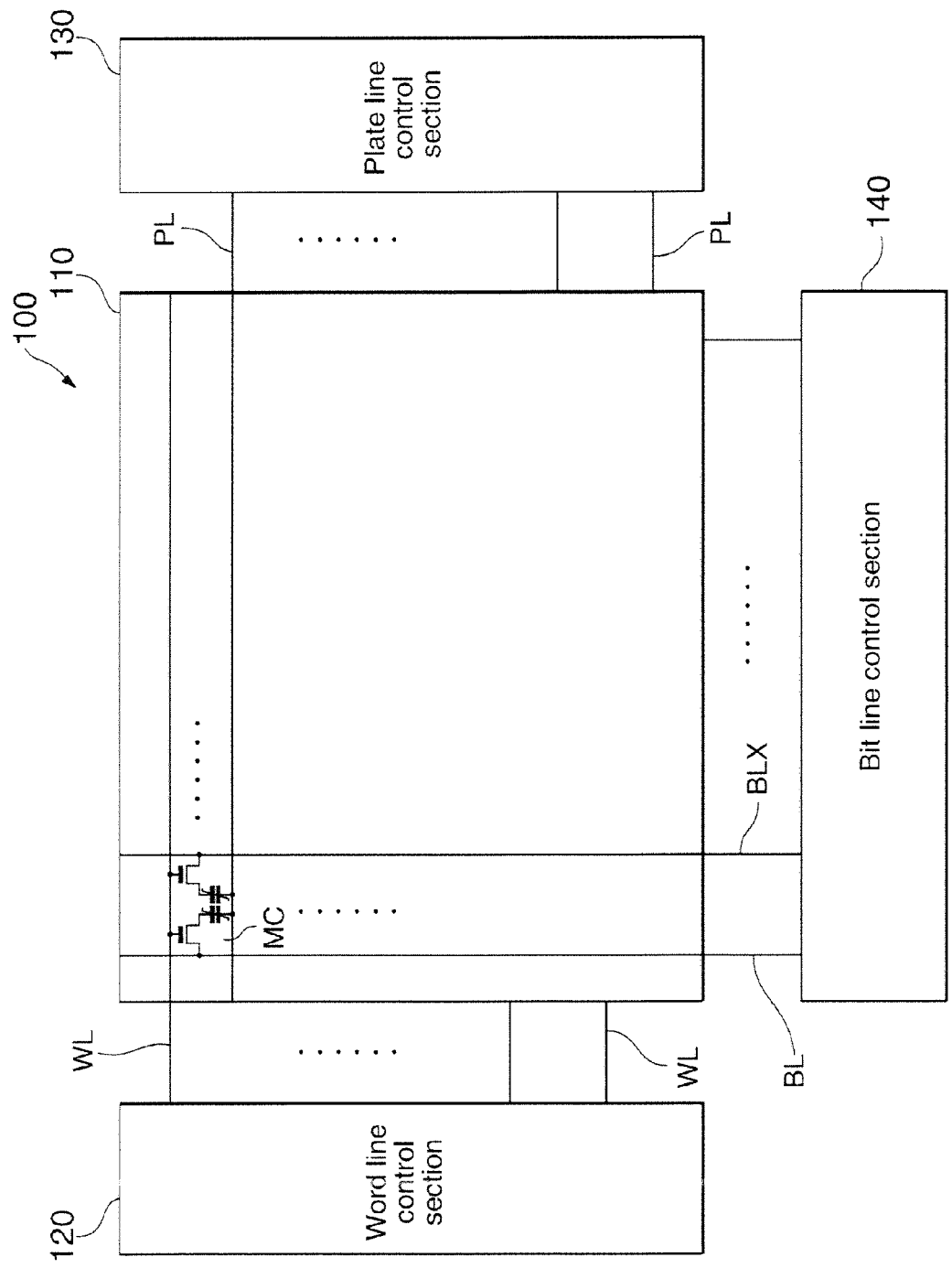
FIG. 1 is a block diagram showing the structure of a ferroelectric memory device.

FIG. 1 is a block diagram of the structure of a ferroelectric memory device. As shown in the figure, a ferroelectric memory device 100 includes a memory cell array 110 and peripheral circuit sections (for example, 120, 130, 140, etc.). The memory cell array 110 is formed from a plurality of memory cells MC arranged in an array, wherein each of the memory cells MC is disposed at an intersection between a word line WL and a bit line (BL, BLX). In this embodiment, a 2T2C cell is shown as an example. In this case, each data set is stored by two transistors and two ferroelectric capacitors connected to a bit line BL and a bit line BLX, respectively. Also, the peripheral circuit may include a word line control section 120 and a plate line control section 130 which control voltages on a plurality of word lines WL and a plurality of plate lines PL. By the aforementioned control sections, data stored in the memory cells MC are readout onto the plurality of bit lines BL, or externally supplied data are stored in the memory cells MC through the bit lines BL. Such data reading and writing are performed by a bit line control section 140. For example, the bit line control section 140 is provided with a sense amplifier. In the case of a 2T2C cell, the sense amplifier compares potentials on a bit line pair (a pair of BL and BLX), amplifies the result to judge data (1 or 0) and outputs the same. In the case of a 1T1C cell, the sense amplifier compares a potential on the bit line at the time of readout with a reference potential, amplifies the result to judge data (1 or 0), and outputs the same.

Figure 2:
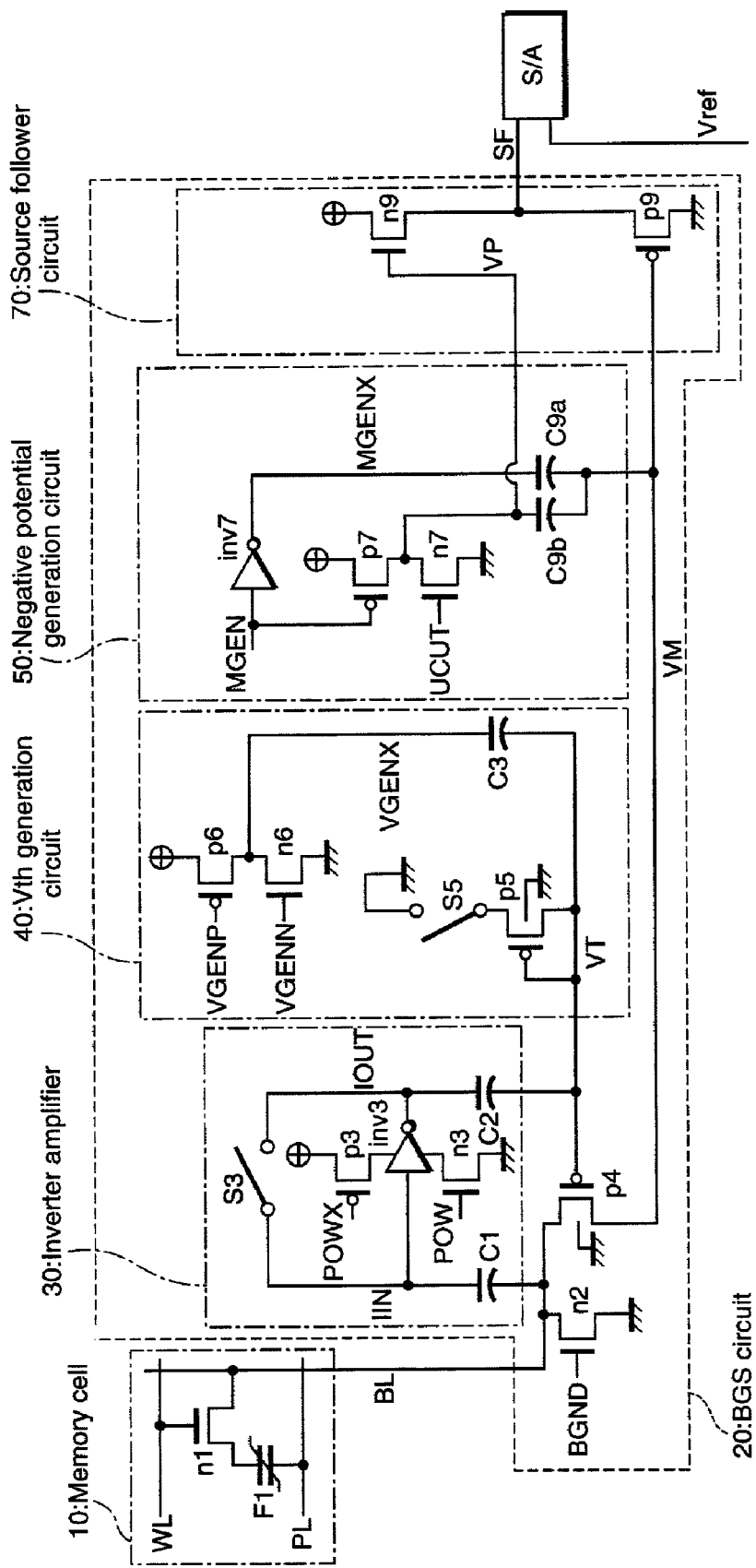
FIG. 2 is a circuit diagram showing the structure of a readout circuit of a ferroelectric memory device in accordance with Embodiment 1 of the invention.

FIG. 2 is a circuit diagram of the structure of a readout circuit of the ferroelectric memory device in accordance with the present embodiment. The readout circuit (a driving circuit, a BGS circuit) 20 includes an inverter amplifier 30, a threshold potential generation circuit (Vth generation circuit) 40, a negative potential generation circuit 50 and a source follower circuit 70.

As described above, a memory cell 10 is disposed at an intersection of a word line WL and a bit line BL, and the memory cell includes a ferroelectric capacitor F1 having one end connected to the plate line PL and an n-channel type MISFET n1 connected between the other end of the ferroelectric capacitor F1 and the bit line BL with its gate electrode being connected to the word line WL.

Also, as shown in the figure, the bit line BL is connected to a node VM through a p-channel type MISFET (a charge transfer MISFET: Metal Insulator Semiconductor Field Effect Transistor) p4.

The gate electrode of the p-channel type MISFET p4 is connected to the threshold voltage generation circuit 40, which applies a threshold potential of the p-channel type MISFET p4 to the MISFET at a predetermined timing.

The threshold voltage generation circuit 40 includes a clamp circuit composed of a p-channel type MISFET p5 with its gate electrode and one end connected to a node VT that is the gate electrode of the p-channel type MISFET p4, and a switching element S5 connected between the other end of the MISFET p5 and the ground potential. Furthermore, the threshold voltage generation circuit 40 includes a capacitor C3 having one end connected to the node VT, and a circuit connected to the other end (node VGENX) of the capacitor. The circuit includes a p-channel type MISFET p6 and an n-channel type MISFET n6 connected in series between the power supply potential (driving potential, Vcc, Vdd) and the ground potential (reference potential, GND, Vss). A signal line VGENP is connected to the gate electrode of the p-channel type MISFET p6, and a signal line VGENN is connected to the gate electrode of the n-channel type MISFET n6. A connection node of these MISFETs (p6, n6) is connected to the other end (node VGENX) of the capacitor C3.

It is noted that a signal line for a signal and the name of the signal may be indicated by the same code. Also, the name of a node and the potential on the node may be indicated by the same code. A and AX are assumed to indicate signals (signal lines) that are in complementary (inverse) relation with one another. Also, the capacitor C3 may be composed of, for example, a paraelectric capacitor. It is noted that the capacitor C3 may also be composed with a ferroelectric capacitor.

Further, the inverter amplifier (inverter amplifier circuit, feedback circuit, control circuit) 30 is connected between the bit line BL and the gate electrode of the p-channel type MISFET p4. The inverter amplifier 30 is formed from an inverter inv3, capacitors C1 and C2, and a switching element S3. The inverter inv3 is composed of a CMOS (Complementary MOS), wherein the source of a p-channel type MISFET (not shown) of the inverter inv3 is connected to the power supply potential through the p-channel type MISFET p3. The source of an n-channel type MISFET (not shown) of the inverter inv3 is connected to the ground potential through the n-channel type MISFT n3. A signal line POWX is connected to the gate electrode of the p-channel type MISFET p3, and a signal line POW is connected to the gate electrode of the n-channel type MISFET n3.

Also, the bit line BL is connected to an input section IIN of the inverter inv3 through the capacitor C1, and the gate electrode of the p-channel type MISFET p4 is connected to an output section IOUT of the inverter inv3 through the capacitor C2. Also, the input section and the output section of the inverter inv3 are connected through the switching element S3. In this example, paraelectric capacitors are used as the capacitors C1 and C2, but ferroelectric capacitors may be used. The inverter amplifier 30 plays a role of more strongly fixing the bit line BL to the ground potential by feeding back the potential on the bit line BL to the gate electrode of the p-channel type MISFET p4.

A discharge circuit is connected to the bit line BL. More concretely, an n-channel type MISFET n2 is connected between the bit line BL and the ground potential, and the gate of the MISFET n2 is connected to a signal line BGND.

The node VM is connected to the negative potential generation circuit 50. The negative potential generation circuit 50 has two capacitors (capacity) C9a and C9b, a p-channel type MISFET p7, an n-channel type MISFET (switching MISFET) n7 and an inverter inv7. The p-channel type MISFET p7 and the n-channel type MISFET n7 are connected in series between the power supply potential and the ground potential, the gate electrode of the p-channel type MISFET p7 is connected to a signal line MGEN, and the gate electrode of the n-channel type MISFET n7 is connected to a signal line UCUT.

One end of the capacitor C9b is connected to the node VM, and the other end (node VP) is connected to a connection node between the p-channel type MISFET p7 and the n-channel type MISFET n7. Also, one of the capacitor 9a is connected to the node VM, and the other end is connected to an output section (node MGENX) of the inverter inv7. An input section of the inverter inv7 is connected to a signal line MGEN.

The negative potential generation circuit 50 is operated to change the potential on the other ends of the two capacitors C9a and C9b from H level (high potential level, power supply potential, driving potential) to L level (low potential level, ground potential), thereby setting the node VM to a negative potential. In other words, the capacitors C9a and C9b in the negative potential generation circuit 50 are changed with negative charge. As a result, when a potential is transferred from the memory cell 10 to the bit line BL, the negative charge stored in the capacitors C9a and C9b in the negative potential generation circuit 50 is transferred through the p-channel type MISFET p4, whereby the bit line BL can be virtually fixed to the ground potential. Therefore, the majority of the readout voltage applied to the plate line PL can be impressed to the ferroelectric capacitor F1 of the memory cell 10, such that the readout margin can be improved. Also, the readout speed can be improved. Moreover, as the impact of the bit line capacitance can be reduced, good characteristics can be maintained even when the bit line length is increased due to an increase in the memory capacity.

Also, the negative potential generation circuit 50 is capable of converting the potential on the node VM to a positive potential. In other words, by setting the other end of the capacitor C9b in a floating state, an increase in the potential on the node VM caused by transfer of the potential from the memory cell 10 can be detected at the other end (node VP) of the capacitor C9b as a potential elevation from L level.

In this manner, the negative potential generation circuit 50 plays a role of a potential generation circuit that sets the node VM to a negative potential before readout, and converts the potential on the node VM to a positive potential at the time of readout. Therefore, an independent positive potential conversion capacitor does not need to be provided, and the area of the circuit can be reduced. Also, a capacitor that is used as a negative potential conversion circuit normally has a greater capacity than that of a capacitor used as a positive potential conversion circuit (for example, a capacitor Ctrans shown in FIG. 5). Because the positive potential conversion is conducted with a capacitor having a large capacity in accordance with the present embodiment, the readout margin can be improved. The improvement of readout margin shall be described in greater detail below.

In the present embodiment, two capacitors C9a and C9b are used. However, the capacitor C9a and the inverter inv7 may be omitted, and operations similar to the above are possible with the capacitor C9b alone. In other words, negative potential conversion and positive potential conversion can be performed by the capacitor C9b. It is noted, however, that, by using the capacitor C9a to adjust the capacity, the range of elevation of the potential on the node VM can be optimized, whereby the readout margin can be improved.

The source follower circuit 70 includes an n-channel type MISFET n9 that is connected between the power supply source and a first input terminal (node SF) of the sense amplifier S/A, wherein the gate electrode of the MISFET n9 is connected to the node VP. Also, the source follower circuit 70 includes a p-channel type MISFET p9 that is connected between the ground potential and the first input terminal of the sense amplifier S/A, wherein the gate electrode of the MISFET p9 is connected to the node VM. A second input terminal of the sense amplifier S/A is connected to a reference potential Vref. By using the source follower circuit 70, the load on the node VP can be alleviated, and the current supply capability for the sense amplifier can be improved.

The sense amplifier S/A compares the potential on the node SF inputted in its first terminal with the reference potential Vref, amplifies the result, and outputs a readout signal.

Figure 3:
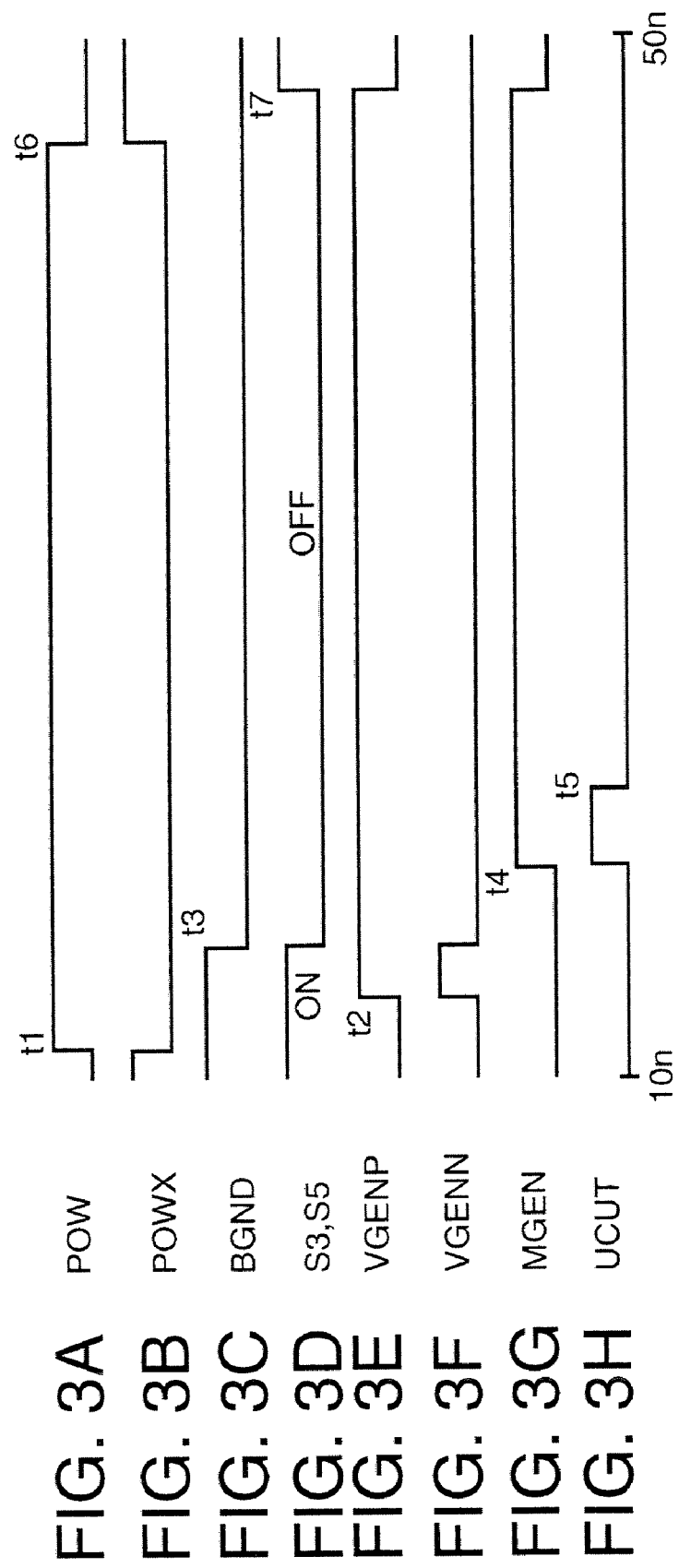
FIG. 3 is a timing chart at the time of readout of the ferroelectric memory device in accordance with Embodiment 1.
Figure 4:
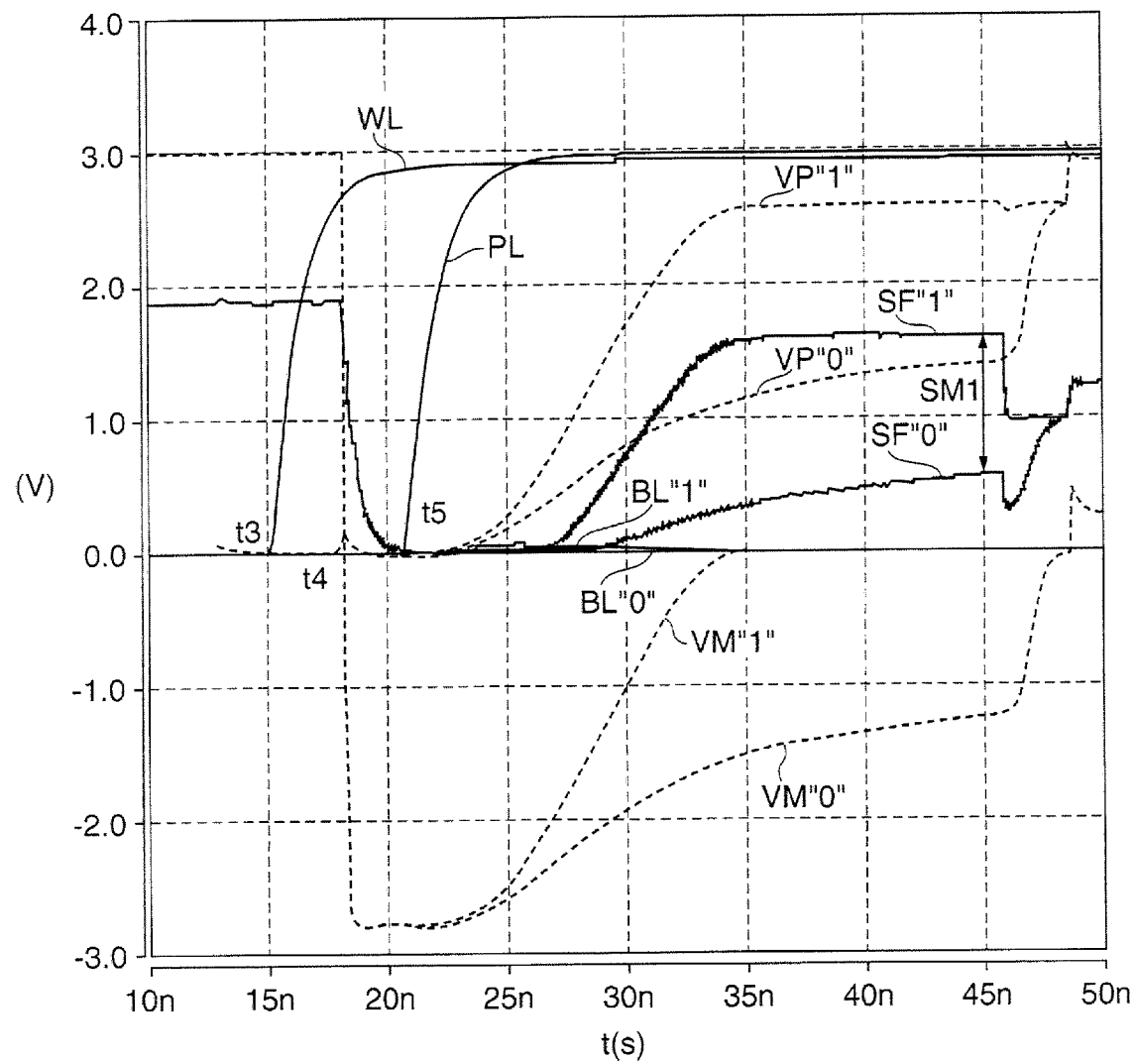
FIG. 4 is a timing chart at the time of readout of the ferroelectric memory device in accordance with Embodiment 1.

Next, a readout operation of the ferroelectric memory device having the readout circuit described above shall be described. FIG. 3 and FIG. 4 show timing charts (potential simulation) at the time of the readout operation of the ferroelectric memory device.

As indicated by (A) and (B) of FIG. 3, at time t1, the signal POW and the signal POWX, control signals of the inverter amplifier 30, are set at H level and L level, respectively, whereby the inverter inv3 is set in an operation state.

Then, as indicated by (E) and (F) of FIG. 3, at time t2, the signal VGENP and the signal VGENN, control signals of the threshold potential generation circuit 40, are changed from L level to H level. At this time, the switching element S5 is in ON state (ON state, conductive state). Therefore, the potential on the node VGENX changes from H level to L level, whereby the potential on the node VT lowers, and is set at a potential that is defined by the clamp circuit, in this case, at a threshold potential of the p-channel type MISFET p4.

Then, at time t3, the switching elements S3 and S5 are set in off state (OFF state, non-conductive state). By the steps described above, operational preparation of the inverter amplifier 30 is completed. It is noted that, since the switching element S3 has been in ON state ((D) in FIG. 3), the input and output nodes of the inverter inv3 are connected, and the potential on these nodes is maintained at a potential that is about half the power supply potential (about ½ Vcc).

Also, at time t3, the potential on the word line WL is changed from L level to H level (see WL in FIG. 4). Also, the signal BGND that is a control signal of the discharge circuit for the bit line BL is changed from H level to L level ((C) in FIG. 3), whereby the bit line BL, that has been fixed at L level, is set in a floating state.

Next, as indicated by (G) and (H) in FIG. 3, the signal MGEN and the signal UCUT, control signals of the negative potential generation circuit 50, are changed from L level to H level, whereby ON and OFF states of the p-channel type MISFET p7 and the n-channel type MISFET n7, respectively, are set in OFF and ON states, respectively, thereby changing the potential on the node MGENX and the node VP from H level to L level. The change in the potential is transmitted through the capacitors C9a and C9b, whereby the potential on the node VM changes from L level to a negative potential (see VM in FIG. 4). In other words, a negative charge is charged in the capacitors C9a and C9b. At this moment, it is desirable to lower the potential on the node VM to about −Vdd.

Then, at time t5, the potential on the plate line PL is raised, in other words, is changed from L level to H level, to readout a charge (data) stored in the ferroelectric capacitor F1 of the memory cell 10. The charge is transferred to the bit line BL through the n-channel type MISFET n1.

Here, in the present embodiment, at time t5, the signal UCUT that is a control signal of the negative potential generation circuit 50 is changed from H level to L level, thereby setting the n-channel type MISFET n7 in OFF state and the node VP in a floating state. The level drop of the signal UCUT does not need to be concurrent with the potential level elevation on the plate line PL, and may be before or after the potential level elevation on the plate line PL. It is noted that, when the level drop of the signal UCUT is made to occur before or concurrently with the potential level elevation on the plate line PL, the readout characteristic can be improved.

By the readout operation described above, the potential on the bit line BL rises. As the potential elevation is amplified in a reverse phase by the inverter amplifier 30, the potential on the node VT lowers. As the input and output node of the inverter inv3 are maintained in advance at about ½ Vcc, it is possible to instantaneously respond to a change in the potential on the bit line. The amount of change (drop amount) in the potential depends on the amount of change (elevation amount) in the potential on the bit line BL, in other words, depends on the difference in the amount of charge between "0" data and "1" data stored in the ferroelectric capacitor F1 of the memory cell 10. It is noted that the simulation shows changes in the potential at each node in the case of "0" data and "1" data.

When the potential on the node VT lowers, the p-channel type MISFET p4 turns on. Accordingly, the charge is transferred from the bit line BL to the capacitors C9a and C9b that are charged with a negative potential, and the potential on the node VM rises (see VM in FIG. 4). When the charge of the memory cell 10 is completely transferred to the capacitors C9a and C9b, the potential on the bit line BL lowers thereby elevating the potential on the node VT. As a result, the p-channel type MISFET p4 turns off, whereby the potential elevation of the node VM stops.

On the other hand, in response to an elevation in the potential on the node VM, this potential change is transmitted to the node VP through the capacitor C9b, whereby the potential on the node VP rises from L level to a positive potential (see VP in FIG. 4). In this manner, the potential on the node VM can be converted to a positive potential by the capacitor C9b. Accordingly, there is no need to provide an independent capacitor for positive potential conversion, and the readout margin can be improved as the positive potential conversion is done with the capacitor having a large capacity for hitting a negative potential.

Due to the elevation in the potential on the node VP, the source follower circuit 70 is operated, whereby the potential on the node SF rises (see SF in FIG. 4). More specifically, due to the elevation in the potential on the node VP, the gate voltage on the n-channel type MISFET n9 becomes greater, and the n-channel type MISFET n9 of the source follower circuit 40 is set in ON state in response to the potential elevation, whereby the potential on the node SF rises. On the other hand, the gate electrode of the p-channel type MISFET p9 of the source follower circuit 40 is connected to the node VM, and is set in OFF state by the potential elevation on the node VM.

Then, the sense amplifier S/A is activated, and compares the node SF with a reference potential Vref, whereby a determination of "0" data or "1" can be made. The sense amplifier S/A amplifies the potential difference and outputs as a readout signal (output OUT).

Next, referring to a circuit of a comparison example (see FIG. 5), the effects of the present embodiment shall be described in greater detail.

Figure 5:
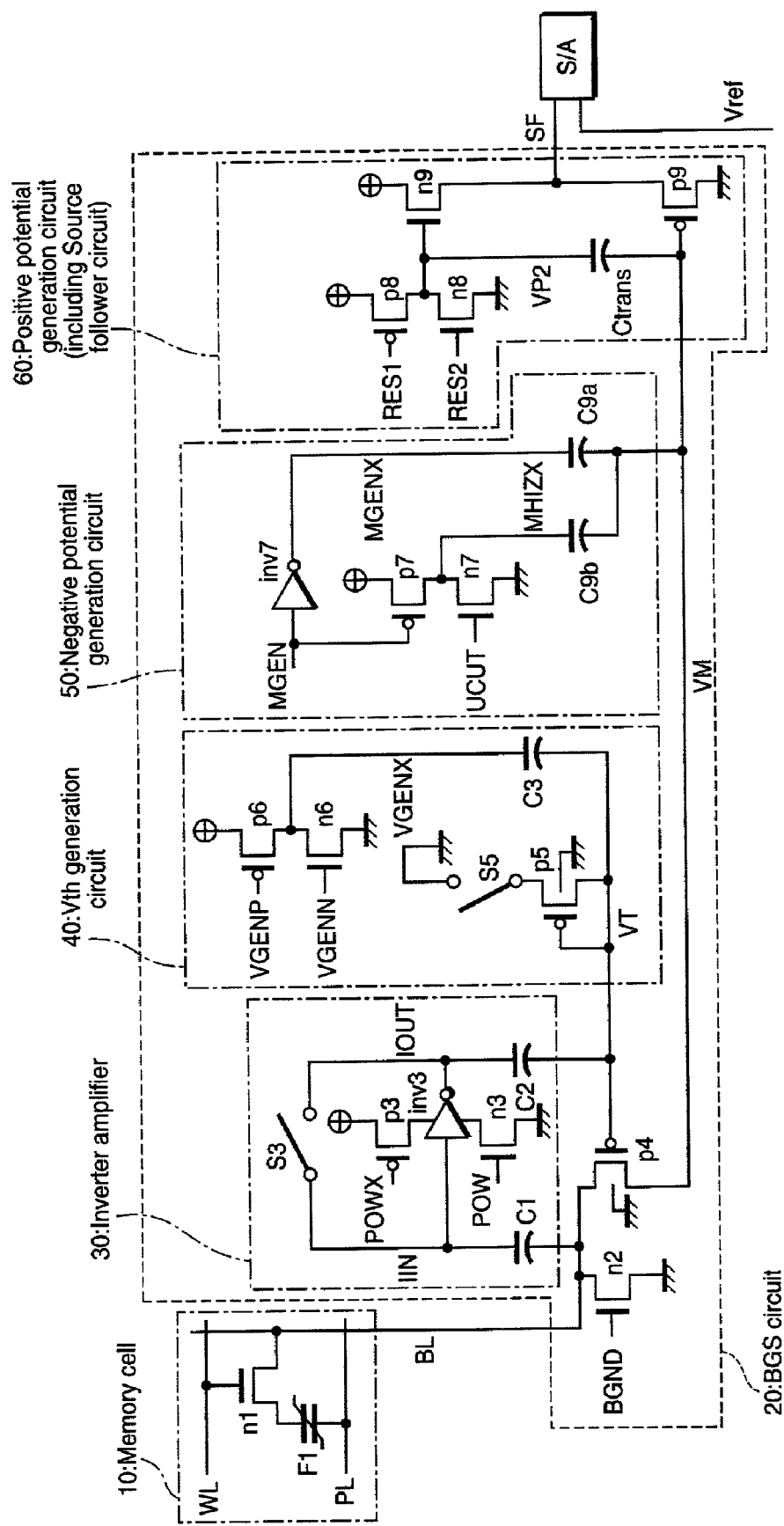
FIG. 5 is a circuit diagram of a readout circuit that uses a positive potential converter circuit 60.

FIG. 5 is a circuit diagram of a readout circuit that uses a positive potential conversion circuit 60. It is noted that components in FIG. 5 identical with those shown in FIG. 2 shall be appended with the same reference numerals, and their detailed description shall be omitted.

The circuit shown in FIG. 5 includes a positive potential conversion circuit 60 connected to the node VM. The positive potential conversion circuit 60 includes a capacitor Ctrans having one end connected to the node VM. A p-channel type MISFET p8 is connected between the other end (node VP2) of the capacitor Ctrans and the power supply potential, wherein the gate of the MISFET p8 is connected to a signal line RES1. An n-channel type MISFET n8 is connected between the other end (node VP2) of the capacitor Ctrans and the ground potential, wherein the gate of the MISFET n8 is connected to a signal line RES2.

Furthermore, the other end (node VP2) of the capacitor Ctrans is connected to a source follower circuit. The source follower circuit includes an n-channel type MISEFT n9 that is connected between the power supply potential and a first input terminal (node SF) of a sense amplifier S/A, wherein the gate electrode of the MISFET n9 is connected to the node VP2. The source follower circuit also includes a p-channel type MISFET p9 that is connected between the ground potential and the first input terminal of the sense amplifier S/A, wherein the gate electrode of the MISFET p9 is connected to the node VM. A second input terminal of the sense amplifier S/A is connected to a reference potential Vref. It is noted that, in FIG. 5, a node on the other end of the capacitor C9b is referred to as a node MHIZX.

Figure 6:
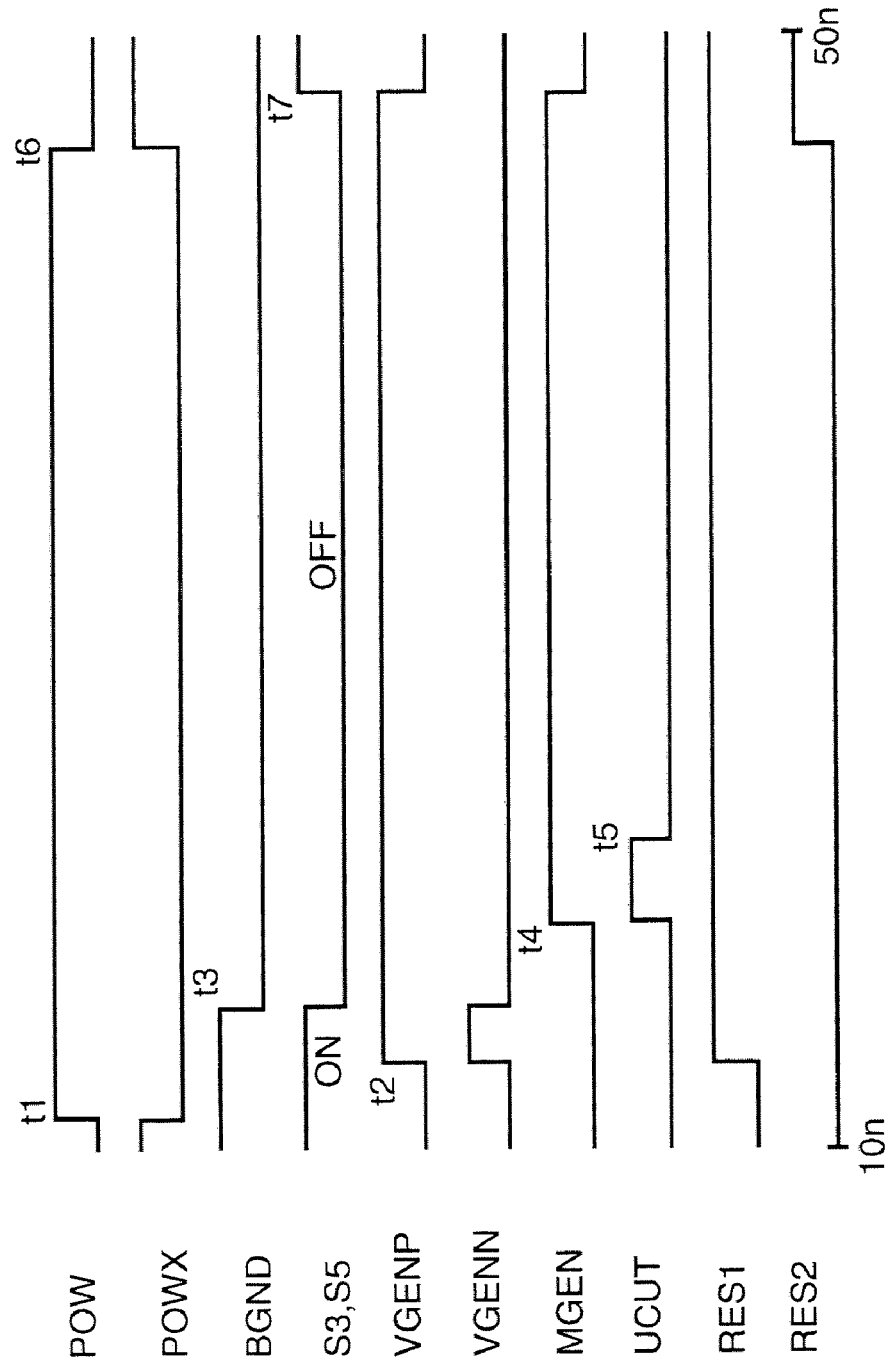
FIG. 6 is a timing chart at the time of readout of the circuit shown in FIG. 5.
Figure 7:
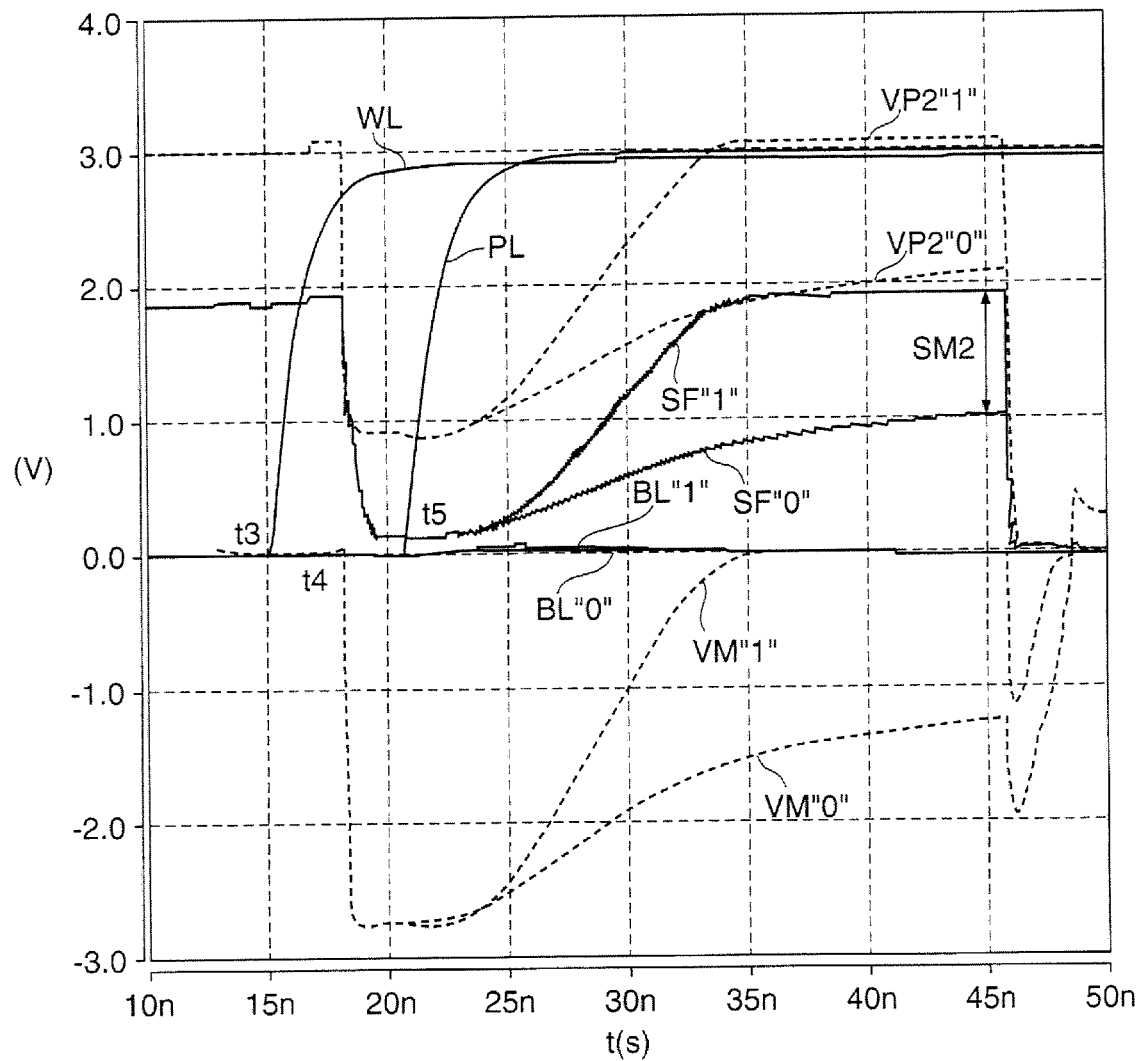
FIG. 7 is a timing chart at the time of readout of the circuit shown in FIG. 5.

FIG. 6 and FIG. 7 are timing charts (potential simulation) at the time of a readout operation of the circuit shown in FIG. 5.

Timing charts (A) through (H) of FIG. 6 are identical with the timing charts (A) through (H) of FIG. 3, such that the node VM in FIG. 6 operates in a similar manner as the circuit shown in FIG. 2. However, as shown in FIG. 5, the node VM is connected to the capacitor Ctrans, such that the potential on the node VM is converted to a positive potential by the capacitor Ctrans.

In other words, control signals of the positive potential conversion circuit 60, the signals RES1 and RES2, are both at L level at time t1 (as indicated by (I) and (J) in FIG. 6), such that the power supply potential is supplied to the node VP 2. Then, at time t2, the signal RES1 changes to H level ((I) in FIG. 6), whereby the node VP 2 is set in a floating state, and the potential on the node VP2 changes according to the potential on the node VM. In other words, the potential VP2 lowers (t4) in response to a drop in the potential on the node VM caused by the operation of the negative potential generation circuit 50, and then, the potential VP2 rises according to an elevation in the potential on the node VM caused by a readout operation of the memory cell 10 (see VP2 in FIG. 7).

In this manner, the circuit shown in FIG. 5 is capable of the readout operation similar to the present embodiment (as shown in FIG. 2), but a difference between SF "0" and SF "1" (i.e., sense margin) is smaller, as observed from the comparison between FIG. 4 and FIG. 7. For example, let us compare the sense margins at 45 ns. In the case of the present embodiment shown in FIG. 4, the sense margin SM1 is about 1.05 V, while the sense margin SM2 is about 0.9 V in the case of the comparison example shown in FIG. 5.

Figure 8A:
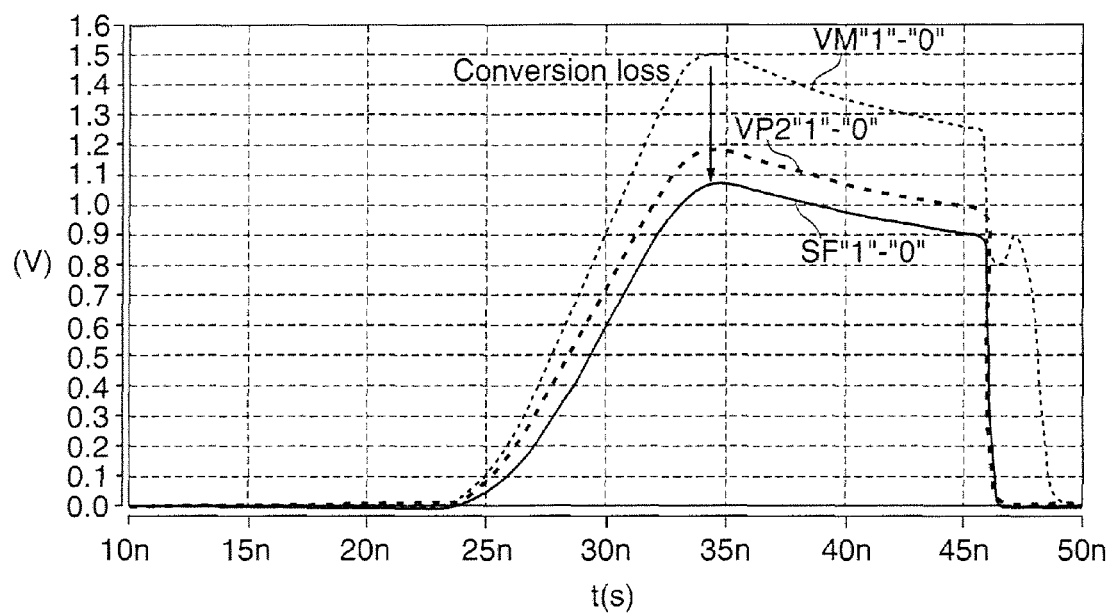
FIGS. 8A and 8B are graphs showing potential differences at each node in the circuits shown in FIG. 5 and FIG. 2.
Figure 8B:
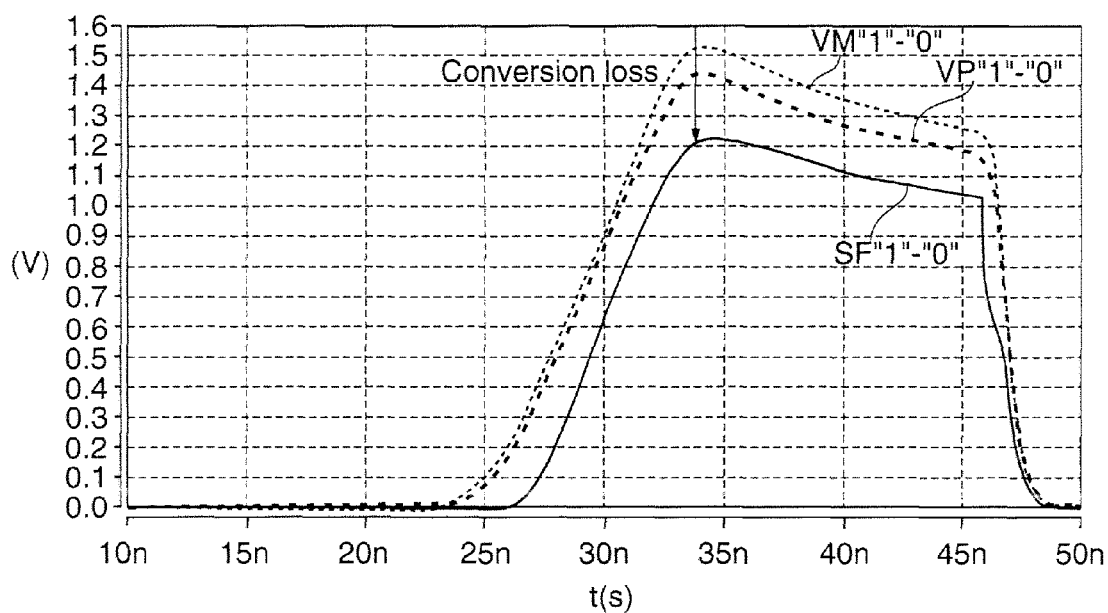

FIGS. 8A and 8B are graphs showing potential differences (margins) at each node in each of the circuits. FIG. 8A shows the case of FIG. 5 (comparison example), and FIG. 8B shows the case of FIG. 3 (present embodiment). More specifically, these figures show potential differences between 1 data and 0 data ("1"-"0") at the node VM, the node VP or the node VP2, and the node SF. It is observed, as shown in the figures, that the present embodiment has smaller potential difference drops at each of the nodes, and has smaller conversion losses. In this manner, in accordance with the present embodiment, the conversion loss can be controlled, and a greater sense margin can be secured.

Embodiment 2

The embodiment 1 uses the source follower circuit 70, but the source follower circuit may be omitted.

Figure 9:
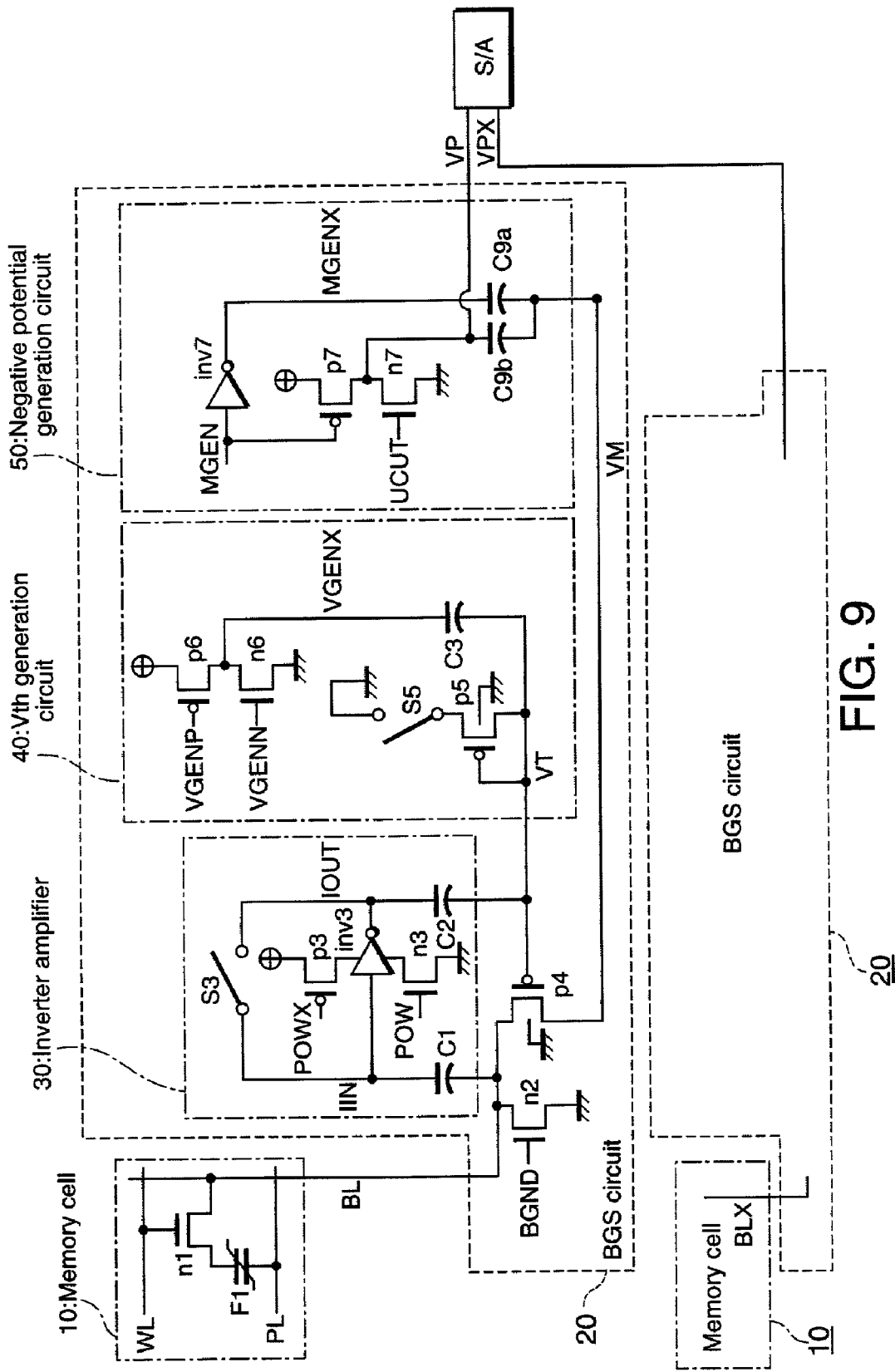
FIG. 9 is a circuit diagram of the structure of a readout circuit of a ferroelectric memory device in accordance with Embodiment 2 of the invention.

FIG. 9 is a circuit diagram showing the structure of a readout circuit of the ferroelectric memory device in accordance with the present embodiment. It is noted that components in FIG. 9 identical with those of the embodiment 1 (shown in FIG. 2) shall be appended with the same reference numerals, and their detailed description shall be omitted.

As shown in FIG. 9, in accordance with the embodiment 2, a source follower circuit 70 is omitted, and the node VP is directly connected to a first input terminal of the sense amplifier S/A. In accordance with the present embodiment, the memory cell has a 2T2C cell structure; and among a bit line pair (BL and BLX), the bit line BLX is also connected to a similar BGS circuit 20. Accordingly, a node VPX, corresponding to the node VP, is connected to a second input terminal of the sense amplifier S/A, and these potentials are compared and the result is amplified, thereby performing a readout. It is noted that the present embodiment may be applied to a 1T1C cell, wherein a reference potential Vref may be applied to the second input terminal.

Figure 10:
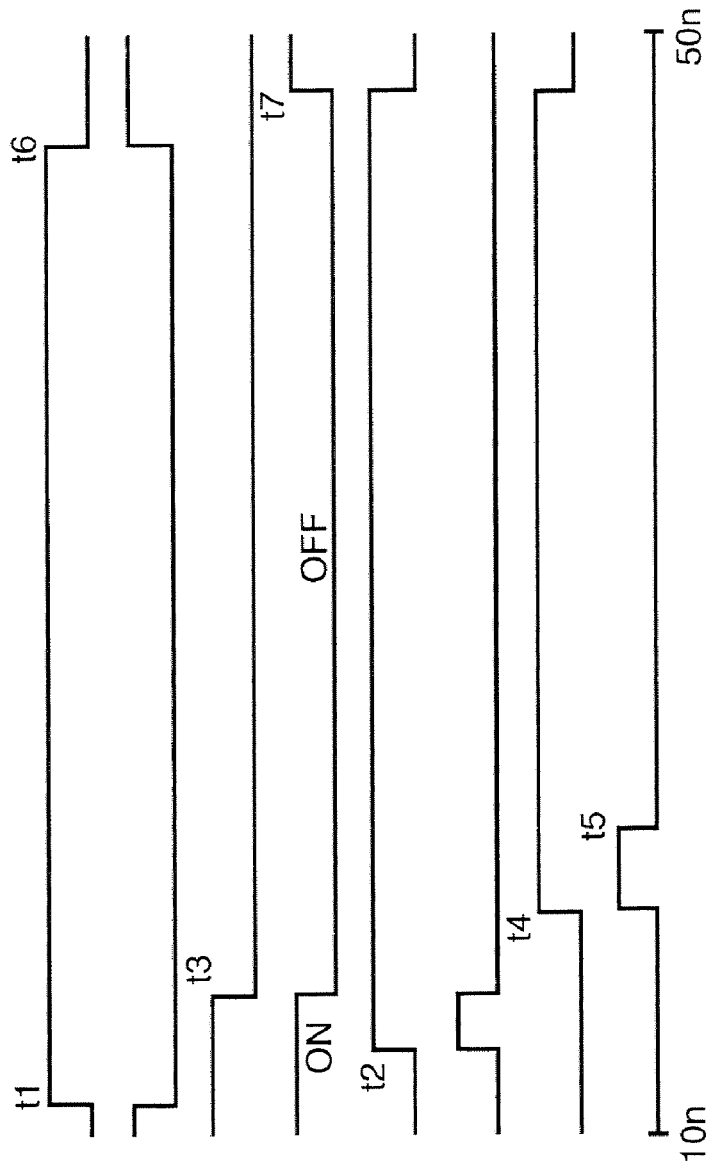
FIG. 10 is a timing chart at the time of readout of the ferroelectric memory device in accordance with Embodiment 2.
Figure 11:
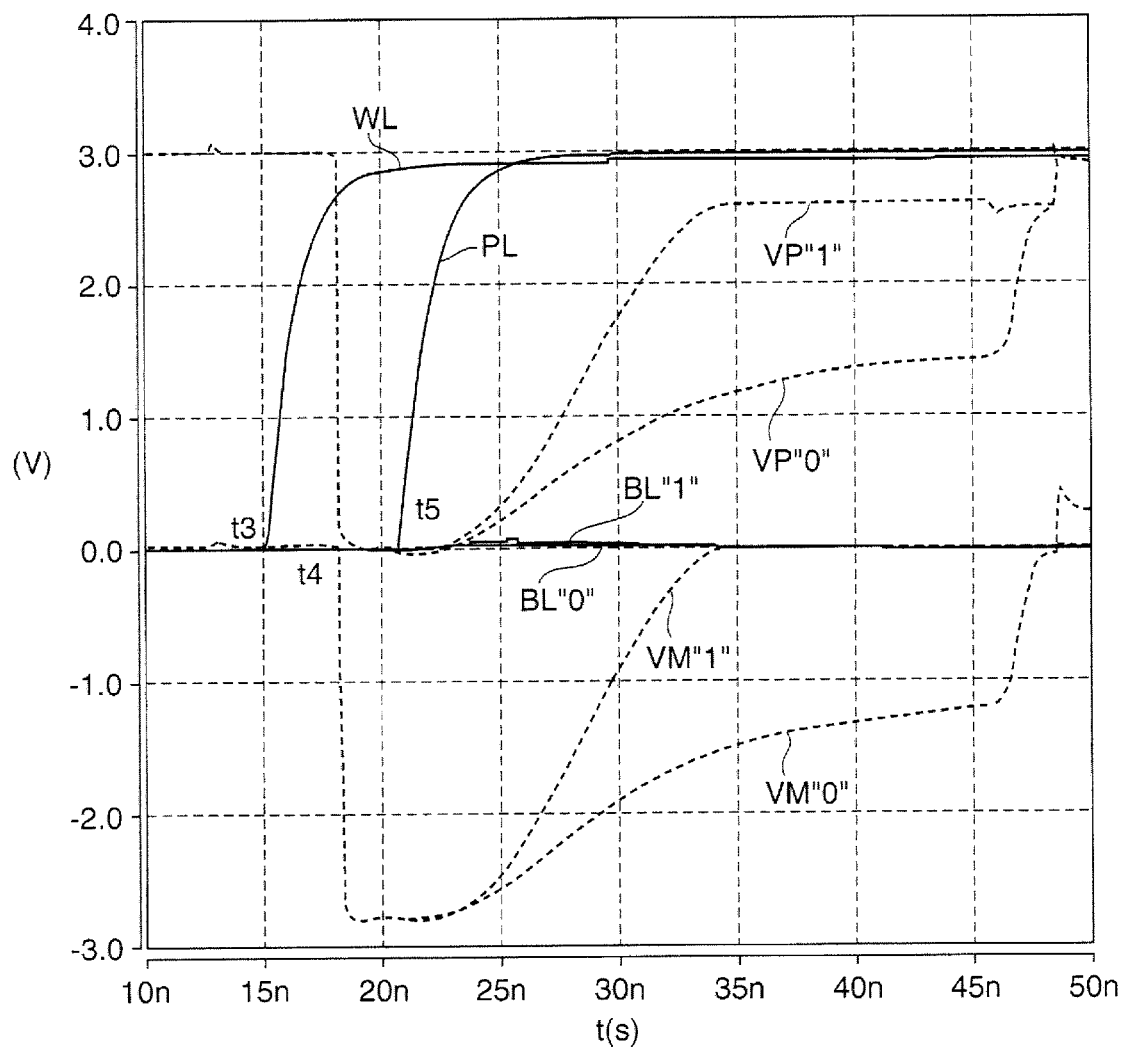
FIG. 11 is a timing chart at the time of readout of the ferroelectric memory device in accordance with Embodiment 2.

FIG. 10 and FIG. 11 are timing charts (potential simulation) at the time of a readout operation of the ferroelectric memory device in accordance with the present embodiment.

Changes in each of the signals shown in FIG. 10 are the same as those of the embodiment 1 (FIG. 3). In this case, there is no conversion loss by the source follower circuit 70, in other words, there is no loss in conversion (transfer) of the potential from the node VP to the node SF, such that the sense margin (the potential difference of VP "1"-VP "0") can be made greater (see FIG. 11).

Figure 12:
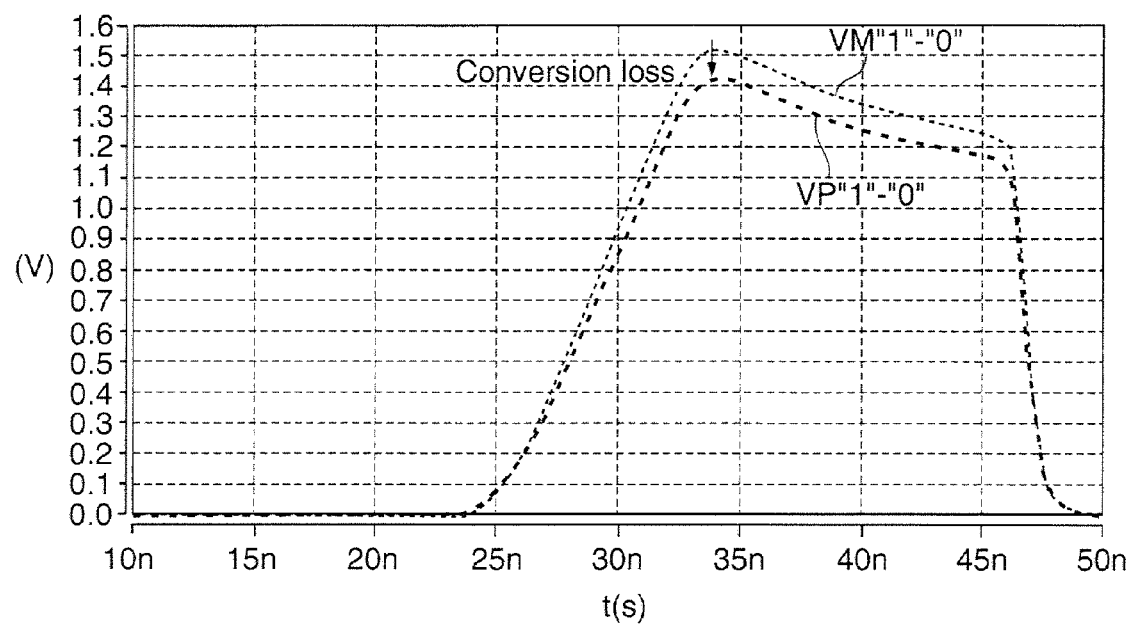
FIG. 12 is a graph showing potential differences at each node in the circuit shown in FIG. 9 in accordance with Embodiment 2.

FIG. 12 shows potential differences (margins) at each of the nodes in the circuit of the present embodiment (shown in FIG. 9). In this case, compared to the comparison example (shown in FIG. 8A) and the embodiment 1 (shown in FIG. 8B), the conversion loss can be further reduced.

It is noted that, in the embodiment 1, the ferroelectric memory device having a memory cell structure of 1T1C is described. However, the embodiment 1 is also applicable to ferroelectric memory devices having a memory cell structure of 2T2C. In this case, like the embodiment 2, the node VPX may be connected to the second input terminal of the sense amplifier S/A (see FIG. 9).

It is noted that embodiment examples and application examples described above with reference to the embodiments of the invention may be used through appropriately combining them, or with modifications or improvements added thereto depending on the usages, and the invention is not limited to the description of the embodiments presented above.

What is claimed is:

1. A ferroelectric memory device comprising:
   a memory cell having a ferroelectric capacitor connected between a plate line and a bit line;
   a first node connected to the bit line through a charge transfer MISFET;
   a potential generation circuit that has a first capacitor having a first terminal connected to the first node and a first switching MISFET connected to a second terminal of the first capacitor, and is capable of setting the first node to a negative potential; and
   a sense amplifier connected to the second terminal of the first capacitor,
   wherein, when reading a charge stored in the ferroelectric capacitor, the potential generation circuit sets the first node at a negative potential and then sets the first switching MISFET to an off state, thereby setting the second terminal of the first capacitor to a floating state, and the sense amplifier amplifies a potential on the second terminal of the first capacitor in the floating state.

2. A ferroelectric memory device according to claim 1, wherein the first switching MISFET is connected between a ground potential and the second terminal of the first capacitor, and the potential generation circuit has a second switching MISFET connected between a power supply potential and the second terminal of the first capacitor.

3. A ferroelectric memory device according to claim 2, wherein, by setting the first and second switching MISFETs from OFF and ON states to ON and OFF states, respectively, the first node is set to a negative potential; and by setting the first and second switching MISFETs to OFF and OFF states, respectively, the second terminal of the first capacitor is set to a floating state.

4. A ferroelectric memory device according to claim 1, wherein the potential generation circuit has a first inverter, and a second capacitor connected between an output of the first inverter and the first node.

5. A ferroelectric memory device according to claim 1, comprising a source follower circuit between the second terminal of the first capacitor and the sense amplifier.

6. A ferroelectric memory device according to claim 5, wherein the source follower circuit has a first MISFET that has a gate electrode connected to the second terminal of the first capacitor and is connected between the power supply potential and the sense amplifier, and a second MISFET that has a gate electrode connected to the first node and is connected between the ground potential and the sense amplifier.

7. A ferroelectric memory device according to claim 1, comprising a threshold potential generation circuit that is connected to a gate electrode of the charge transfer MISFET.

8. A ferroelectric memory device according to claim 1, wherein the charge transfer MISFET is a p-channel type MISFET.

9. A ferroelectric memory device according to claim 1, comprising a control circuit that is connected between the bit line and a gate electrode of the charge transfer MISFET, and controls the potential to be applied to the gate electrode according to the potential on the bit line.

10. A ferroelectric memory device according to claim 9, wherein the control circuit has a second inverter that is connected between the bit line and the gate electrode of the charge transfer MISFET, the second inverter having an input section connected to the bit line through a third capacitor, and an output section connected to a gate electrode of the charge transfer MISFET through a fourth capacitor.

11. An electronic equipment comprising the ferroelectric memory device recited in claim 1.

12. A method for driving a ferroelectric memory device that has a memory cell having a ferroelectric capacitor connected between a plate line and a bit line, a first node connected to the bit line through a charge transfer MISFET, a potential generation circuit that has a first capacitor having a first terminal connected to the first node and a switching MISFET connected to a second terminal of the first capacitor, and a sense amplifier connected to the second terminal of the first capacitor, the method comprising the steps of:
   1) changing the potential on the second terminal of the first capacitor from a high potential level to a low potential level to set the first node to a negative potential;
   2) setting the switching MISFET to an off state, after the step 1);
   3) changing the potential on the plate line from a low potential level to a high potential level to transfer a charge stored in the ferroelectric capacitor to the first node through the charge transfer MISFET, after the step 1); and
   amplifying the potential on the second terminal of the first capacitor by the sense amplifier, after the step 2), thereby conducting a readout operation.

* * * * *